(12) United States Patent
Fang et al.

(10) Patent No.: US 6,380,339 B1
(45) Date of Patent: Apr. 30, 2002

(54) SILICON-CONTAINING VINYL COPOLYMER AND RESIST COMPOSITION CONTAINING THE SAME

(75) Inventors: Mao-Ching Fang, Hsinchu; Ming-Chia Tai, Hsinchu Hsien; Jui-Fa Chang; Ting-Chun Liu, both of Hsinchu; Tzu-Yu Lin, Hsinchu Hsien, all of (TW)

(73) Assignee: Industrial Technology Research Institute, Hsinchu (TW)

( * ) Notice: Subject to any disclaimer, the term of this patent is extended or adjusted under 35 U.S.C. 154(b) by 0 days.

(21) Appl. No.: 09/749,073

(22) Filed: Dec. 27, 2000

(30) Foreign Application Priority Data

Sep. 22, 2000 (TW) ........................................ 89119569 A

(51) Int. Cl.$^7$ ............................................. C08F 130/08
(52) U.S. Cl. .................. 526/279; 526/270; 526/271; 526/272
(58) Field of Search ................................ 526/270, 271, 526/272, 279

(56) References Cited

FOREIGN PATENT DOCUMENTS

| JP | 2001-81142 | * | 3/2001 |
| WO | WO 99/42903 | | 8/1999 |

OTHER PUBLICATIONS

Kim, et al., *Proceedings of SPIE*, vol. 3999, 1079–1087, 2000.

Kim et al., *Polymer*, 40, 1617–1621, 1999.

* cited by examiner

*Primary Examiner*—Helen L. Pezzuto
(74) *Attorney, Agent, or Firm*—Darby & Darby

(57) ABSTRACT

The present invention relates to a silicon-containing vinyl copolymer which includes a maleic anhydride repeating unit, a norbornene repeating unit with an acid-labile group, and a vinyl repeating unit with a silicon-containing group. The silicon-containing vinyl copolymer is suitable for use as a top layer resist in a bilayer resist system.

19 Claims, No Drawings

SILICON-CONTAINING VINYL COPOLYMER AND RESIST COMPOSITION CONTAINING THE SAME

BACKGROUND OF THE INVENTION

1. Field of the Invention

The present invention relates to a silicon-containing vinyl copolymer, and more particularly to a resist composition containing the silicon-containing vinyl copolymer. The silicon-containing vinyl copolymer is suitable for use as a top layer resist in a bilayer resist system.

2. Description of the Prior Art

With increasing integration of semiconductor devices, there is a heightened need to form finer patterns in photolithography processes. Both 248 nm and 193 nm photolithography technologies are necessitated in fabricating microelectronic devices, and many efforts have been made to develop a suitable photoresist material for operating at such short wavelengths.

When a single layer resist is used in the short wavelength photolithography, even if an anti-reflection resist layer is applied, the depth of focus (DOF) will be decreased, and the stability control capacity of the process will become worse. Therefore, a bilayer resist has been developed to improve the resolution and the stability control capacity of the process. The bilayer resist includes a thicker underlayer made of a resin, which can planarize the substrate and decrease the reflection, and a thinner silicon-containing top layer made of a silicon-containing polymer, which is photosensitive and has good resistance toward oxygen plasma etching.

Kim et al. have disclosed a silicon-containing methacrylate-based polymer for use as a top layer of a bilayer resist system, in which 2-trimethylsilyl-2-propyl is introduced as an acid labile protective group into the methacrylate unit [Polymer, 40, 1617–1621 (1999)]. Upon exposure and post exposure bake (PEB), the silicon-containing labile group will be removed, thus resulting in a different solubility between the exposed and unexposed regions. Therefore, the resist can be developed by a conventional developer. In addition, since the underlayer resin and the top layer resist have different silicon contents, the pattern of the top layer can be transferred to the underlayer by dry etching using oxygen reactive ion etching (RIE).

Kim et al. have further disclosed a silicon-containing norbornene-based polymer, which is poly(5-((2-trimethylsilyl-2-propyl)oxycarbonyl)-norbornene-co-maleic anhydride) [SPIE, 3999, 1079–1087 (2000)]. In this norbornene-based polymer, 2-trimethylsilyl-2-propyl ester is introduced as an acid labile protective group into the norbornene unit.

Schaedeli et al. in WO 99/42903 have disclosed a methacrylate-based terpolymer, in which tris(trimethylsiloxy)silylpropyl is introduced into the methacrylate unit.

However, the conventional bilayer resist suffers from the disadvantages that the silicon-containing polymer has inferior film forming properties and the film cracks easily. Further, the low glass transition temperature makes that the post exposure baking temperature can not be too high, which adversely affects the diffusion rate of the photoacid. In addition, the adhesion between the top photosensitive layer and the resin underlayer is inferior. Therefore, there is still a need to develop an improved silicon-containing polymer for a bilayer resist system.

SUMMARY OF THE INVENTION

Therefore, an object of the present invention is to solve the above-mentioned problems and to provide a novel silicon-containing copolymer having a high glass transition temperature and a better polarity.

Another object of the present invention is to provide a resist composition having good adhesion to a resin underlayer for use in a bilayer resist system.

To achieve the above objects, the silicon-containing copolymer of the present invention is a silicon-containing vinyl copolymer, which includes repeating units represented by the following formulae

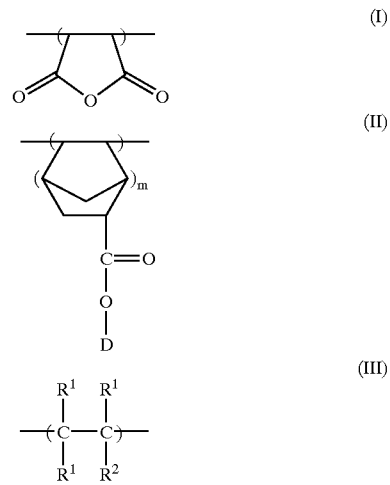

wherein m is 1 or 2;

D is an acid-labile protective group, which decomposes in the presence of an acid, so as to make the silicon-containing vinyl copolymer alkali-soluble;

$R^1$ is selected from the group consisting of hydrogen and $C_{1-8}$ linear and branched alkyl; and $R^2$ is selected from the group consisting of

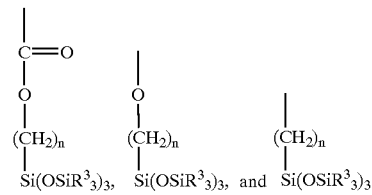

wherein n is 0 or an integer of from 1 to 6, and $R^3$ is $C_{1-8}$ linear or branched alkyl.

DETAILED DESCRIPTION OF THE INVENTION

The silicon-containing vinyl copolymer of the present invention can be prepared from the corresponding monomers by any suitable conventional polymerization methods, such as, by free radical, controlled radical or group transfer polymerization.

According to the present invention, the silicon-containing vinyl copolymer includes three repeating units, that is, a maleic anhydride repeating unit represented by formula (I), a norbornene repeating unit represented by formula (II), and a vinyl repeating unit represented by formula (III). The norbornene repeating unit (II) includes an acid-labile group D, and the vinyl repeating unit (III) includes a silicon-containing group $R^2$. Different from the conventional silicon-containing polymer, the silicon-containing group of the present invention, $R^2$, is introduced into the vinyl repeating unit, rather than a norbornene repeating unit. In the silicon-containing vinyl copolymer of the present invention, the mole fractions of the repeating units (I), (II), and (III) are 10-50:10-50:10-50, preferably 30-50:20-40:20-40.

According to a preferred example of the present invention, $R^2$ can be

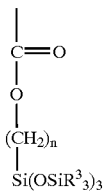

wherein n is 0 or an integer of from 1 to 6, and $R^3$ is $C_{1-8}$ linear or branched alkyl. Preferably, n is 0 or an integer of from 1 to 3. Most preferably, n is 3, $R^3$ is methyl, thus, $R^2$ is

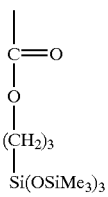

According to another preferred example of the present invention, $R^2$ can be

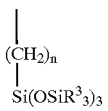

wherein n is 0 or an integer of from 1 to 6, and $R^3$ is $C_{1-8}$ linear or branched alkyl. Preferably, n=0, and $R^3$ is methyl, thus, $R^2$ is

In the norbornene repeating unit (formula (II)), D is an acid-labile protective group, which decomposes in the presence of an acid, so as to make the silicon-containing vinyl copolymer alkali-soluble. Representative examples of D include:

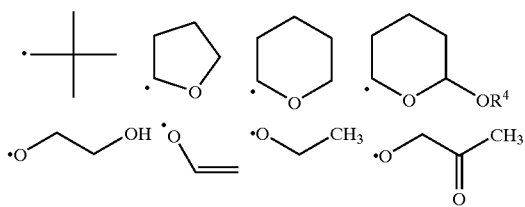

-continued

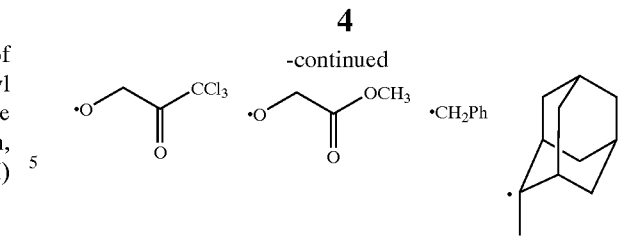

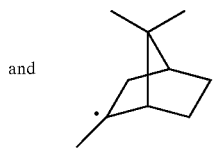

and wherein $R^4$ is selected from the group consisting of hydrogen, $C_{1-20}$ linear and branched alkyl, $C_{3-20}$ cyclic and pericyclic alkyl.

The silicon-containing vinyl copolymer of the present invention has a weight average molecular weight of 3000 to 100000, is soluble in an organic solvent, and is suitable for use as a resin in thin film coating. The silicon-containing vinyl copolymer of the present invention can be used with a photoacid generator (PAG) to form a resist composition. The photoacid generator is preferably present in an amount of from 0.03 to 20% by weight of the silicon-containing vinyl copolymer.

Any suitable photoacid generator may be used. Preferred photoacid generators include, but are not limited to, triarylsulfonium salts, diaryliodonium salts, sulfonates, and mixtures thereof. Representative examples of the triarylsulfonium salts include triphenyltriflate, triphenylantimonate, methoxytriphenyltriflate, methoxytriphenylantimonate, trimethyltriphenyltriflate, and naphthalenetriflate. Representative examples of the diaryliodonium salts include diphenyliodoniumtriflate, di-t-butylbisphenyl-antimonate, and di-t-butylbisphenyltriflate.

The resist composition of the present invention is photosensitive at a wavelength of 100 nm to 300 nm, preferably at a wavelength of 193 nm or 248 nm.

The resist composition of the present invention can be used as a top layer in a bilayer resist system. First, a resin underlayer is coated on a silicon wafer and then cured by baking. Next, the resin composition of the present invention, which includes the silicon-containing vinyl copolymer, is coated onto the silicon wafer with the resin underlayer and then baked to form a top layer.

The wafer, which has been coated with the resin underlayer and the silicon-containing top resist layer, is exposed to radiation through a mask and then baked. Upon exposure, the labile group D in the silicon-containing vinyl copolymer of the present invention will be removed. Therefore, the exposed region of the top layer can be removed by developing the wafer with a conventional developer. Thus, a pattern of the top layer can be formed.

The patterned wafer is then subjected to oxygen plasma etching. In the unexposed region, silicon contained in the surface of the top layer will react with oxygen plasma to form nonvolatile products (i.e., $SiO_2$). In the exposed region, the underlayer will react with oxygen plasma to form volatile products and will be readily evaporated by etching. Therefore, the pattern of the silicon-containing resist top layer can be transferred to the resin underlayer accordingly.

With regard to the resin underlayer, the resin suitable for use in the present invention can be phenolic resins, particularly novolak resins, such as formaldehyde cresol or formaldehyde phenol novolaks, polyimide resins, poly(meth)acrylate resins and styrene-allyl alcohol copolymer resins.

By means of the maleic anhydride repeating unit, the adhesion of the silicon-containing vinyl copolymer of the present invention to the resin underlayer can be increased. By means of both the maleic anhydride and norbornene repeating units, the degree of freedom of the copolymer backbone can be decreased, which will make the copolymer have a higher glass transition temperature (Tg). In addition, film cracking problem can also be solved.

The following examples are intended to illustrate the process and the advantages of the present invention more fully without limiting its scope, since numerous modifications and variations will be apparent to those skilled in the art.

EXAMPLE 1

Preparation of Silicon-containing Vinyl Copolymer (A)

In a 3-neck flask, 0.04 mole of maleic anhydride was dissolved in 25 ml of tetrahydrofuran (THF) under nitrogen, stirred and heated to 70° C. 0.02 mole of 3-(methyloloxy) propyl-tris(methyl-siloxy)silane (a silicon-containing monomer), 0.02 mole of t-butyl 5-norbornene-2-carboxylate, and 1.625 g of azobisisobutyronitrile (AIBN) (initiator) were mixed in 25 ml of THF, and then the solution was added dropwise to the THF solution of maleic anhydride over 1 hour. The mixture was stirred at 70° C. for 12 hours. Then, the reaction solution was dropped in a mixed solution of a large amount of methanol and water for precipitation. The mixture was filtered, dried under vacuum at 50° C. for 12 hours, washed with n-hexane, filtered, and dried. The yield was 70%.

The silicon-containing vinyl copolymer (A) obtained has a weight average molecular weight (Mw) of 9542 determined by GPC (WATERS Model 600), a glass transition temperature (Tg) of 137° C. and a decomposition temperature (Td) of 209° C. determined by DSC (PERKIN ELMER DSC7) and TGA (PERKIN ELMER TGA7).

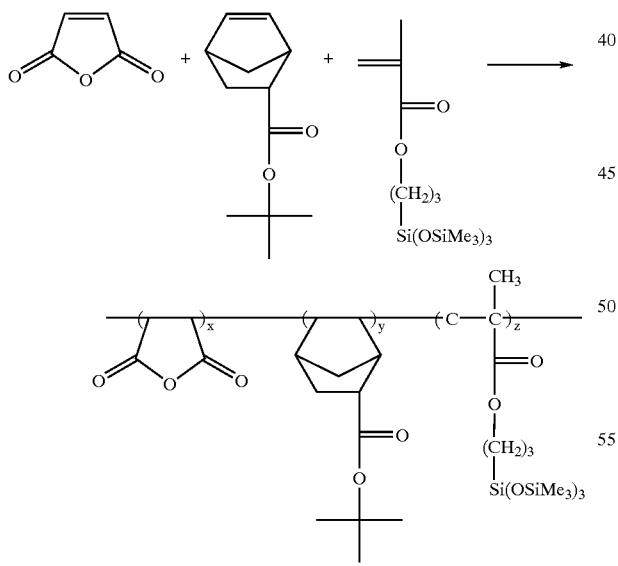

EXAMPLE 2

Preparation of Silicon-containing Vinyl Copolymer (B)

In a 3-neck flask, 0.04 mole of maleic anhydride was dissolved in 25 ml of tetrahydrofuran (THF) under nitrogen, stirred and heated to 70° C. 0.02 mole of tris (trimethylsiloxy)vinylsilane, 0.02 mole of t-butyl 5-norbornene-2-carboxylate, and 1.625 g of azobisisobutyronitrile (AIBN) (initiator) were mixed in 25 ml of THF, and then the solution was added dropwise to the THF solution of maleic anhydride over 1 hour. The mixture was stirred at 70° C. for 12 hours. Then, the reaction solution was dropped in a mixed solution of a large amount of methanol and water for precipitation. The mixture was filtered, dried under vacuum at 50° C. for 12 hours, washed with n-hexane, filtered, and dried. The yield was 80%.

The silicon-containing vinyl copolymer (B) obtained has a weight average molecular weight (Mw) of 4056 determined by GPC (WATERS Model 600), a Tg of 110° C. and a Td of 163° C. determined by DSC (PERKIN ELMER DSC7) and TGA (PERKIN ELMER TGA7).

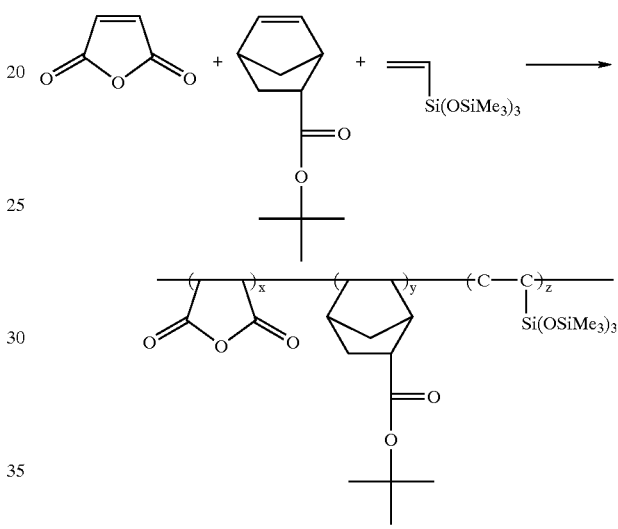

EXAMPLE 3

Preparation of Silicon-containing Resist 1.43 g of the silicon-containing vinyl copolymer (A) obtained from Example 1, 0.051 g of triphenylsulfonium nonafluorosulfate (PAG; photoacid generator), 0.0012 g of 1-piperidine ethanol (killer base) and 11 g of propylene glycol methyl ether acetate (PGMEA) were mixed and stirred for 1 day. The mixture was filtered through a 0.2 μm filter.

EXAMPLE 4

Coating of the Resin Underlayer 2.5 ml of PFI38A9 resist available from Sumitomo was spin coated on an 8-inch wafer using a Polaris 2000 Microlithography Cluster Coater at 4000 rpm. The wafer was baked at 250° C. for 120 seconds to generate thermal curing. Then, the wafer was cooled to 23° C. and a resin underlayer of 7000Å thick was obtained.

EXAMPLE 5

Photolithographic Evaluation of the Silicon-containing Resist 2 ml of the silicon-containing resist obtained from Example 3 was spin coated on the silicon wafer with the resin underlayer at 3000 rpm and baked at 130° C. for 90 seconds. Then, the wafer was cooled to 23° C. and a top silicon-containing resist layer of 2000 Å was obtained. The coated wafer was exposed through a mask using a 0.6NA ISI 193 nm Stepper and then baked at 120° C. for 90 seconds. The wafer was then cooled to 23° C. and developed for 60 seconds using 0.262 N tetramethylammonium hydroxide (TMAH) solution. The wafer was then rinsed with distilled water and spin dried to form a resist pattern. It was confirmed by scanning electron microscopy (SEM) that the resist could resolve line-and-space patterns (L/S patterns) as small as less than 0.15 μm. The silicon-containing resist top layer and resin underlayer showed good film forming properties and adhesion. The coated wafer had high photosensitive properties and the dose-to-clear energy ($E_0$) was 6.5 mJ.

EXAMPLE 6

Dry Etching

The pattern of the silicon-containing resist top layer was transferred to the resin underlayer by dry etching using a TCP9400 etcher available from Lam Research Company. The dry etching conditions were as follows: 500 W (Source), 75 W (Bias), −10° C., 10 mT pressure, 20 sccm $O_2$ flow, 30 sccm $SO_2$ flow, and 30 seconds. Images from SEM after etching showed that the wall angle was approximately vertical and the resist could resolve line-and-space patterns (L/S patterns) as small as less than 0.15 μm.

The foregoing description of the preferred embodiments of this invention has been presented for purposes of illustration and description. Obvious modifications or variations are possible in light of the above teaching. The embodiments chosen and described provide an excellent illustration of the principles of this invention and its practical application to thereby enable those skilled in the art to utilize the invention in various embodiments and with various modifications as are suited to the particular use contemplated. All such modifications and variations are within the scope of the present invention as determined by the appended claims when interpreted in accordance with the breadth to which they are fairly, legally, and equitably entitled.

What is claimed is:

1. A silicon-containing vinyl copolymer comprising repeating units represented by the following formulae

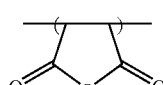 (I)

 (II)

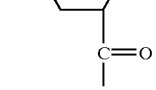

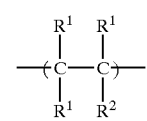 (III)

wherein m is 1 or 2;

D is an acid-labile protective group, which decomposes in the presence of an acid, so as to make the silicon-containing vinyl copolymer alkali-soluble;

$R^1$ is selected from the group consisting of hydrogen and $C_{1-8}$ linear and branched alkyl; and $R^2$ is selected from the group consisting of

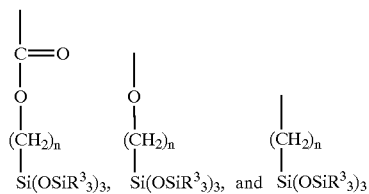

wherein n is 0 or an integer of from 1 to 6, and $R^3$ is $C_{1-8}$ linear or branched alkyl.

2. The silicon-containing vinyl copolymer as claimed in claim 1, wherein $R^2$ is

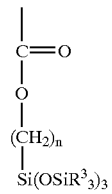

wherein n is 0 or an integer of from 1 to 6, and $R^3$ is $C_{1-8}$ linear or branched alkyl.

3. The silicon-containing vinyl copolymer as claimed in claim 2, wherein n is 0 or an integer of from 1 to 3.

4. The silicon-containing vinyl copolymer as claimed in claim 3, wherein $R^2$ is

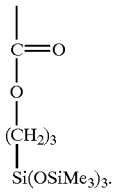

5. The silicon-containing vinyl copolymer as claimed in claim 1, wherein $R^2$ is

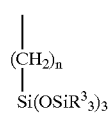

wherein n is 0 or an integer of from 1 to 6, and $R^3$ is $C_{1-8}$ linear or branched alkyl.

6. The silicon-containing vinyl copolymer as claimed in claim 5, wherein n is 0.

7. The silicon-containing vinyl copolymer as claimed in claim 6, wherein $R^2$ is

8. The silicon-containing vinyl copolymer as claimed in claim 1, wherein D is selected from the group consisting of

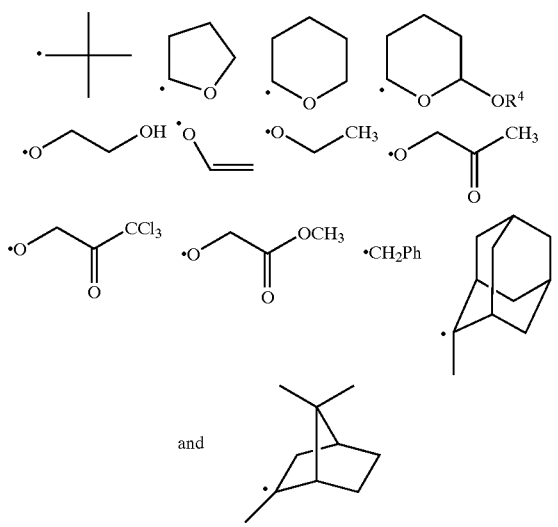

wherein $R^4$ is selected from the group consisting of hydrogen, $C_{1-20}$ linear and branched alkyl, $C_{3-20}$ cyclic and pericyclic alkyl.

9. The silicon-containing vinyl copolymer as claimed in claim 8, wherein D is

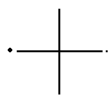

10. The silicon-containing vinyl copolymer as claimed in claim 1, wherein the copolymer has a weight average molecular weight of 3000 to 100000.

11. The silicon-containing vinyl copolymer as claimed in claim 1, wherein the copolymer can be used as a top layer resist in a bilayer resist system.

12. The silicon-containing vinyl copolymer as claimed in claim 1, wherein the mole fractions of the repeating units (I), (II), and (III) are 10-50:10-50:10-50.

13. The silicon-containing vinyl copolymer as claimed in claim 12, wherein the mole fractions of the repeating units (I), (II), and (III) are 30-50:20-40:20-40.

14. A resist composition comprising the silicon-containing vinyl copolymer as claimed in claim 1 and a photoacid generator, wherein the photoacid generator is present in an amount of from 0.03 to 20% by weight of the copolymer.

15. The resist composition as claimed in claim 14, wherein the photoacid generator is selected from the group consisting of triarylsulfonium salts, diaryliodonium salts, sulfonates, and mixtures thereof.

16. The resist composition as claimed in claim 15, wherein the triarylsulfonium salt is selected from the group consisting of triphenyltriflate, triphenylantimonate, methoxytriphenyltriflate, methoxytriphenylantimonate, trimethyltriphenyltriflate, and naphthalenetriflate.

17. The resist composition as claimed in claim 15, wherein the diaryliodonium salt is selected from the group consisting of diphenyliodoniumtriflate, di-t-butylbisphenyl-antimonate, and di-t-butylbisphenyltriflate.

18. The resist composition as claimed in claim 14, wherein the composition is photosensitive at a wavelength of 100 nm to 300 nm.

19. The resist composition as claimed in claim 18, wherein the composition is photosensitive at a wavelength of 193 nm or 248 nm.

* * * * *